United States Patent [19]
DeShazo

[11] Patent Number: 5,420,499
[45] Date of Patent: May 30, 1995

[54] CURRENT RISE AND FALL TIME LIMITED VOLTAGE FOLLOWER

[76] Inventor: Thomas R. DeShazo, 215 Kingwood Rd., Frenchtown, N.J. 08825

[21] Appl. No.: 204,711

[22] Filed: Mar. 2, 1994

[51] Int. Cl.$^6$ .................. G05F 3/16; H03K 3/01
[52] U.S. Cl. .................. 323/315; 327/108; 327/170; 327/322
[58] Field of Search ............... 323/312, 315, 316, 317; 307/296.1, 296.6, 490, 491; 330/288

[56] References Cited

U.S. PATENT DOCUMENTS

| | | | |
|---|---|---|---|
| 4,319,180 | 3/1982 | Nagano | 323/315 |
| 4,775,829 | 10/1988 | Achstaetter | 323/313 |
| 5,015,942 | 5/1991 | Kolanko | 323/315 |
| 5,155,429 | 10/1992 | Nakao et al. | 307/296.6 |
| 5,311,146 | 5/1994 | Brannon et al. | 330/288 |

Primary Examiner—Steven L. Stephan
Assistant Examiner—Matthew V. Nguyen
Attorney, Agent, or Firm—Joel I. Rosenblatt

[57] ABSTRACT

A current rise in fall time limited voltage follow is shown having a voltage driver providing a voltage signal into a current driver. The output of the current driver is a load varying in resistance, for example, as the number or combination of devices connected to the load vary. The maximum current into the load and the maximum rise time of the current into the load is limited at the output of the current driver to a maximum by the input impedance of the current driver. The rise time and the current into the load may increase until the resistance of the load is substantially that of the current driver input resistance reduced by a factor of N. The factor N is the maximum current capability of the output of the current driver related to the current driver input current generated by the voltage signal from the voltage driver. The current into the load and the maximum rise time of the load will increase until the load resistance R is less than the input impedance of the current driver divided by the current multiple N at the output of the current driver related to the current at the input of the current driver.

10 Claims, 2 Drawing Sheets

CURRENT RISE AND FALL TIME LIMITED VOLTAGE FOLLOWER

FIELD OF THE INVENTION

This invention relates to the field of radio frequency interference (RFI). In particular, it relates the field of current limiting devices for limiting the wave form of a signal and particularly the rise time of that signal under changing load conditions.

BACKGROUND OF THE INVENTION

A bus connected to a driver may be connected to different combinations of load devices. These combinations may depend upon operating conditions at any time. For example, a bus may be connected to a driver providing coded current pulses into the bus and connected to receivers for those coded pulses providing a load on the bus. As known to those skilled in the art, the additional receivers added to the bus has the effect of decreasing the bus resistance and increasing the bus conductance. Reducing the amount of bus resistance, increases current provided by the driver. As known to those skilled in the art, the current rise time is related to the voltage at the output of the driver and the load resistance. The current rise time at the load, as known to those skilled in the art, is inversely related to the load resistance. The current into the load is inversely related to the load resistance.

As well known to those skilled in the art, as the current rise time at the output of the driver increases the higher frequency components within the wave form increases, increasing the magnitude of components at radio frequencies and radio frequency interference (RFI).

SUMMARY OF THE INVENTION

A voltage signal is provided to a current driver connected to a bus. The load at the bus may vary, in particular decreasing in resistance and increasing in conductance. As that load decreases, the current into the bus increases. The current into the load and the current rise time is inversely related to that load.

According to the disclosed inventive principles and as shown in the preferred embodiment, the voltage to the current driver is maintained at a maximum level and rise time, independent of the loading effect produced by changing load conditions on the bus. This is accomplished by making a single current driver responsive to the input voltage.

According to the inventive principles, the output of the voltage driver connected to a constant impedance provides a voltage signal with a fixed maximum voltage and constant rise time to the current driver. In the preferred embodiment, that constant impedance is at the input to the primary or master side of a current mirror shown as the current driver for the preferred embodiment. However, as would be known to those skilled in the art, any other current driver may be substituted for the current mirror which would provide a constant load impedance to the voltage driver and responsively, the required current into the bus connected load. The current mirror then serves as a current driver to the bus, providing current for the changing conditions on the bus. These changing conditions may be a decreasing load, such as by increased devices connected to the bus. The decreasing load which would otherwise increase the current rise time at the current driver output, may then be controlled by restricting the maximum current and maximum rise time of the current into the load at the output of the current driver, by the value of the constant impedance presented to the voltage driver at the current driver input.

As shown in the preferred embodiment, a voltage driver uses a capacitor, connected at its output to a current driver shown as a current mirror. The capacitor is charged by a charging current responsive to an input signal. That charging current may be modified in response to the input signal, causing the capacitor to discharge. Accordingly, the capacitor voltage rises and decreases in response to the charging and discharging current.

The rise in voltage over time for the capacitor, as is well known in the art, is equal to the charging current minus the discharging current divided by the capacitor value. The decreasing voltage over time is equal to the discharging current divided by the capacitor value.

According to the inventive principles as shown in the preferred embodiment the maximum current and the maximum rise and fall time of the current (Imax and dI/dt) in response to the voltage dv/dt is maintained over varying load conditions to control the high frequency components and RFI at the output of the current driver output.

In the prior art where a voltage driver was coupled to a load connected as an emitter follower, the rate of change of voltage at the output of the voltage driver was replicated at the output of the voltage follower.

The rate of change of current at the load, as known to those skilled in the art, is proportional to the rate of change of the voltage, dv/dt and inversely proportional to the resistance RLoad. That current rate of change expressed as dI/dt may vary increasing as the load decreased in resistance. As the resistance RLoad approached zero, dI/dt approached infinity.

Where the load RLoad varied, by changing the mix of devices connected to a bus, for example, the current to the load RLoad Connected to the bus would increase in inverse proportion to the decrease in resistance to RLoad.

As known to those skilled in the art, an increase in the current rate of change dI/dt into a load and an increase in the maximum amount of current I produces increased radio frequency interference (RFI).

According to the principles of the invention as shown in the preferred embodiment, RFI is controlled by controlling the maximum amount of current I into a bus connected lead and the maximum rate of change of current with respect to time dI/dt, into the bus, as the resistance on the bus may change due to changes in the loads placed on the bus.

According to the principles of the invention as shown in the preferred embodiment, a voltage driver having a maximum voltage signal with a predetermined rate of change voltage with respect to time, dv/dt, is provided to a first current driver shown in the preferred embodiment as the primary or master side of a current mirror. The current mirror primary is connected to a constant lead RI. Current mirrors are well known to those in the art and are described in detail in *Bipolar and MOS Analog Integrated Circuit Design*, Grebene, A. B., John Wiley & Sons, New York, 1984.

The first current driver is connected to a second current driver. In the preferred embodiment, the second current driver is the slave or secondary side of a current mirror.

In current mirrors, as is well known, the secondary or slave side of the current mirror with the same geometry as the primary or master side, provides the same current as the master side. Accordingly, where the geometries of the primary and secondary of the current mirror are designed to be the same so the current into the primary side of the current mirror is reproduced in the output of the secondary or slave side, then for any lead resistance RLoad, connected to the output of the current mirror secondary with less than the impedance RI at the output of the primary of the current mirror, the rate of change of current at the output of the current mirror dI/dt will be the ratio of the rate of change of voltage dv/dt to the output resistance RI connected to the current mirror primary or master side. Where the resistance of the lead RLoad connected to the secondary or slave side of the current mirror increases to a value higher than the resistance RI at the output of the current mirror primary or master side, then the rate of change of current at the output of the secondary or slave side of the current mirror into the bus dI/dt, would be equal to the ratio of the rate of change of voltage dv/dt at the ! output of the voltage driver and the resistance of the load RLoad connected to the output of the current mirror secondary or slave side.

In summary, where the load connected to the slave side of the current mirror is a resistance RLoad higher than the resistance RI of the output of the current mirror primary, the rate of change of current into the bus is inversely proportional to the resistance of that load RLoad connected to the current mirror secondary. Where the resistance of the load of the bus connected to the secondary of the current mirror is less than the output resistance of the primary of the current mirror, then the rate of change of current into the bus at the output of the current mirror secondary dI/dt is inversely proportional to the resistance RI at the Output of the current mirror primary. The foregoing is the case for an output current from the current driver which is the same as the controlling current in the current driver input.

The value of the resistance RI connected to the current mirror primary or master side determines the maximum rate of change current dI/dt across the load RLoad shown connected to the output of the current mirror primary or slave side. For a current mirror serving as the current driver, the maximum DC current which can flow into the load RLoad is controlled by the resistance RI of the input of the current mirror and for any load RLoad having a resistance less than the resistance RI at the current mirror primary or master side. The maximum current I into the RLoad is proportional to the maximum voltage at the output of the voltage driver reduced by the base to emitter voltage drop within the current mirror and inversely proportional to the resistance RI connected to the output of the current mirror primary or master side.

The configuration of the first and second current drivers, shown in the preferred embodiment as the master or primary side of a current mirror and the slave or secondary side of the current mirror, respectively, may be changed to produce a greater amount of current at the current mirror secondary or slave side relative to a given amount of current at the current mirror primary or master side by a magnitude N, for example. The current into the current mirror primary or master side can be made relatively small compared to the current out of the current mirror slave side or secondary into the load RLoad. In that case, the output of the current mirror secondary or slave side will increase in proportion to decreasing resistance of the load RLoad connected to the bus at the output of the current mirror secondary or slave side until the bus connected resistance RLoad at the current mirror secondary output decreases to a value less than a factor N, where N is the ratio of the resistance RI at the output of the current mirror primary or master side to the resistance of the bus connected load RLoad to the current mirror secondary or slave side. (N<RI/RLoad).

As would be understood by those skilled in the art, the current mirror shown as a current driver for the preferred embodiment, may be replaced by any other suitable current driver providing an impedance RI to the voltage driver, a current to the load RLoad at the output of the current driver and where the maximum current rise time and maximum current is limited by the value of RI.

DESCRIPTION OF PREFERRED EMBODIMENT

Figure 1B:
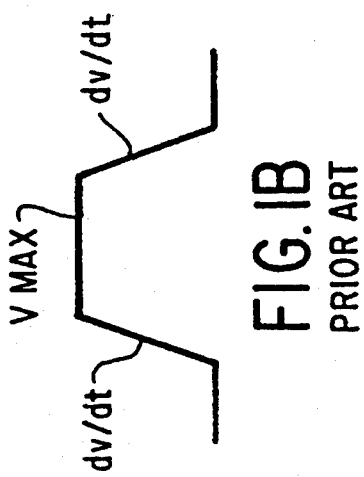
FIG. 1B. shows the voltage signal wave form at the output of the voltage driver shown in FIG. 1A.
Figure 1A:
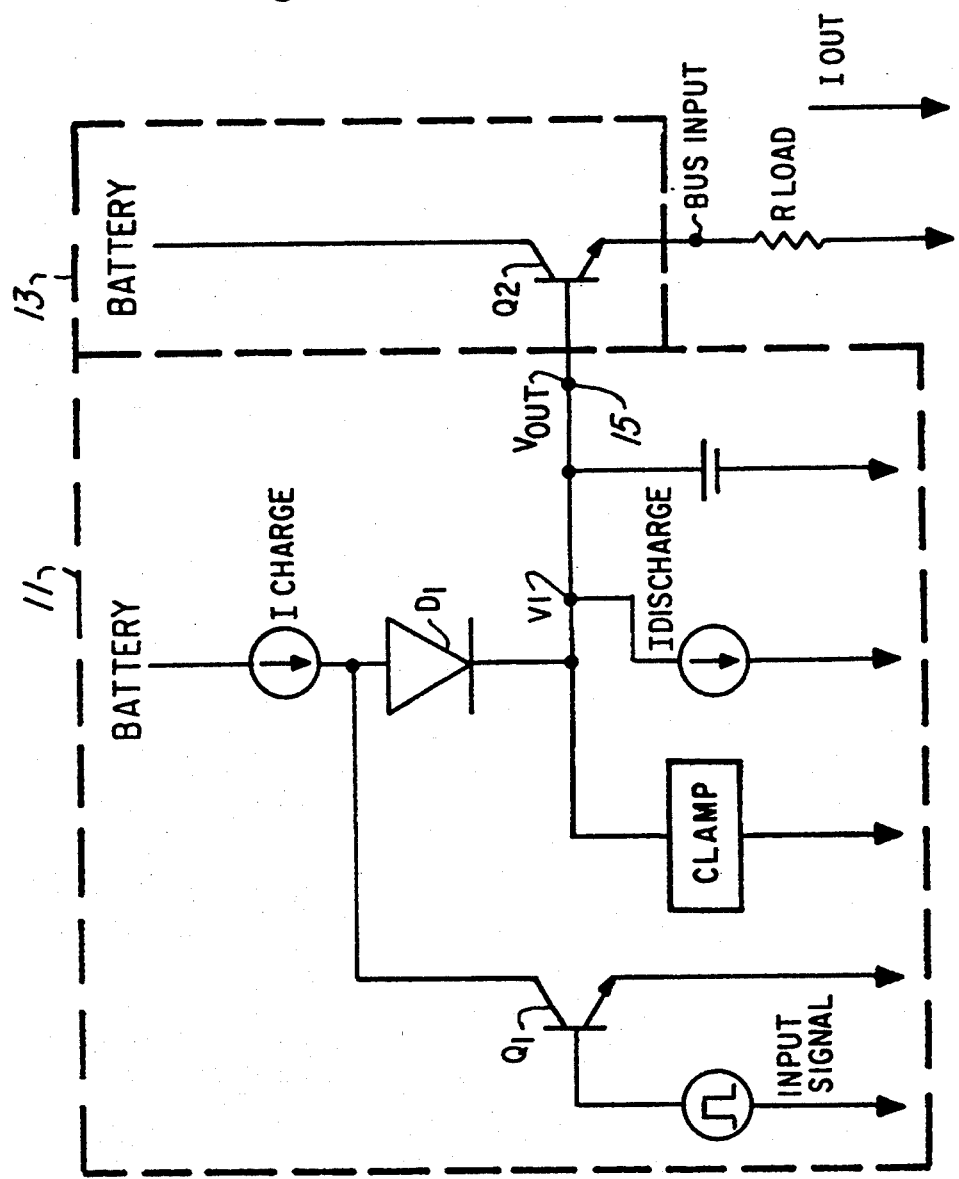
FIG. 1A. shows a prior art apparatus providing a voltage signal into a voltage follower driver current providing a current Iout into a bus connected load RLoad.

The prior art is shown in FIG. 1A. As shown in the prior art, a voltage driver shown in the dashed line enclosed box and identified by numeral 11 provides a voltage output signal at the output of terminal 15 to the current driver shown in the dashed line box 13, the current driver 13 connected to a load shown as RLoad, provides a current in the prior art example is a voltage follower.

As explained, the load RLoad may vary, changing its conductance and the amount of current Iout at the output of the current driver 13.

The voltage driver is shown as having a current source I Charge connected to a diode D1. The diode D1 is connected to a second current source I Discharge and to a Clamp. Connected between the current source I Charge and the diode D1 is a transistor Q1. The base input of the transistor $Q_1$ is connected into an input signal. The Clamp and I Discharge are connected to a capacitor C and an output terminal 15. A voltage Vout is produced at the capacitor C, and at terminal 15. As would be apparent to those skilled in the art, the kind of voltage driver used may be varied consistent with the principles of the invention. The inventive principles are not restricted to the preferred embodiment voltage driver shown in the dashed box 11.

The output of the voltage driver 11 at terminal 15 is connected to the input of an emitter follower current driver shown as 13. The current driver in the preferred embodiment is shown as a transistor Q2 connected to a load RLoad at the Bus Input terminal.

The voltage Vout at the voltage driver 11 output is shown as a truncated wave form in FIG. 1B. As shown, the time rate of change of the voltage output is shown as dv/dt for both the rising and falling edges.

As would be known to those skilled in the art, the resistance RLoad of the load may change, as for example decreasing when additional elements are connected into the Bus, increasing the amount of current drawn by the load and the voltage driver output wave shape at terminal as shown in FIG. 1B.

Where:

$$\frac{dv}{dt} = \frac{Icharge - Idischarge}{\text{capacitor value}} \quad (1)$$

$$\frac{dv}{dt} = \frac{Idischarge}{\text{capacitor value}} \quad (2)$$

The current into the RLoad connected at the Bus Input is $$\frac{dv/dt}{RLoad} \quad (3)$$

As can be seen by equation 3, the rise time of the current dI/dt is inversely proportional to RLoad, increasing as RLoad decreases.

The inventive principles are now described with reference to the preferred embodiment described in detail in FIG. 2.

Figure 2A:
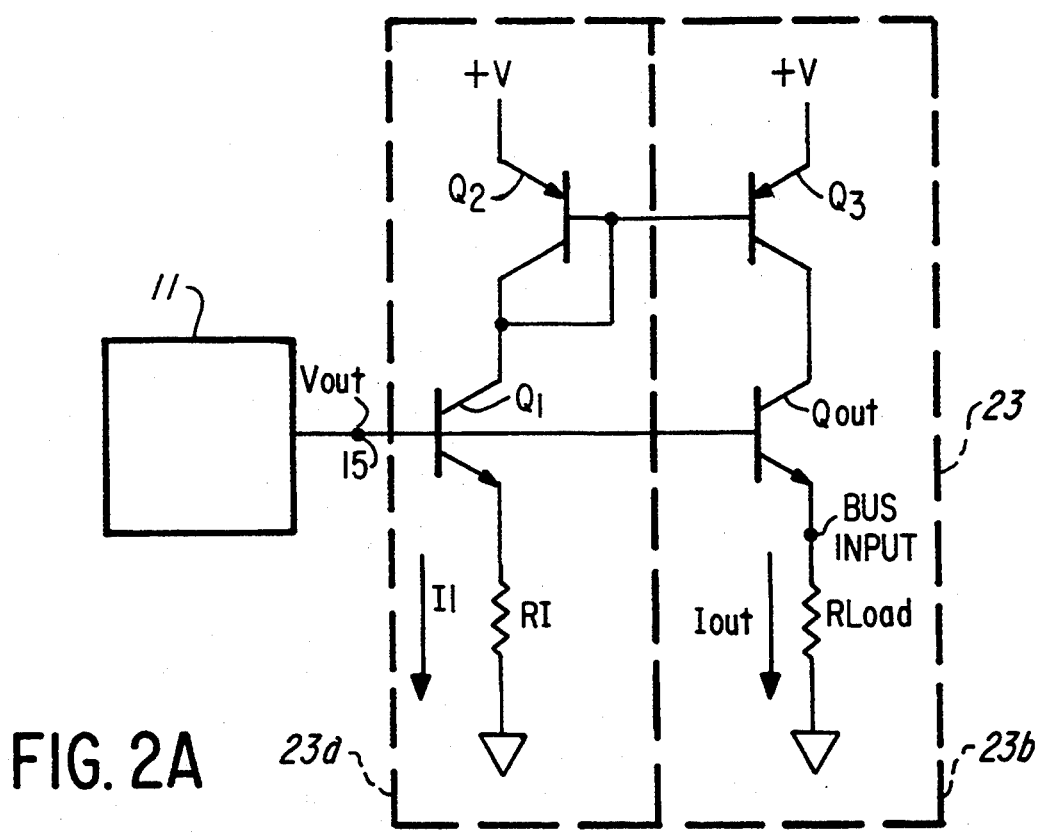
FIG. 2A. shows the preferred embodiment of the current driver according to the inventive principles.
Figure 2B:
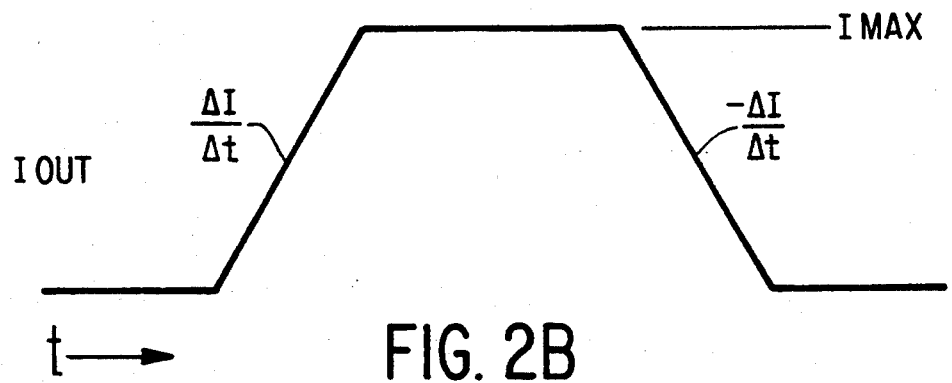
FIG. 2B. shows the output current waveform for the driver shown in FIG. 2A.
Figure 2C:
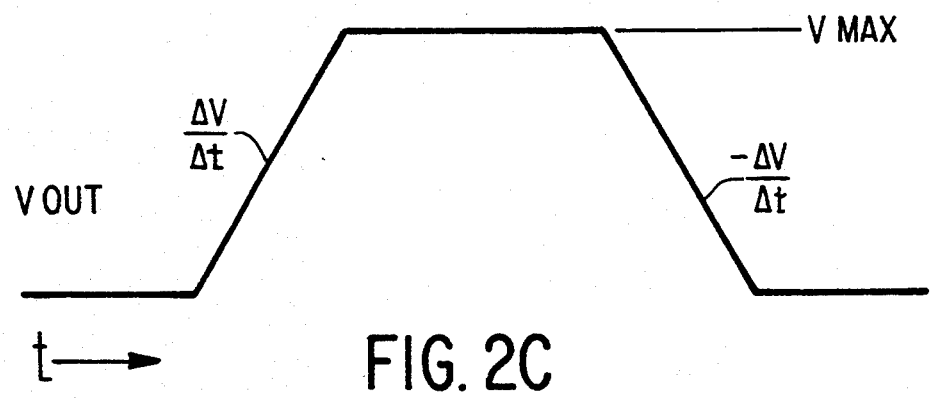
FIG. 2C shows the voltage waveform for Vout as shown in FIG. 2A.

In FIG. 2A., the same numerals indicate the same or similar parts, as in FIG. 1A.

As shown in FIG. 2A., a voltage driver 11 provides a voltage signal Vout, similar to the signal Vout shown in FIG. 1B. at the output terminal 15 of voltage driver 11, as shown in FIG. 1A. That voltage signal as shown for the preferred embodiment has a predetermined maximum Vmax and has a predetermined rise time and fall time dv/dt. The load RLoad shown in the preferred embodiment represents a changing load depending upon the combination of elements connected to the Bus Input terminal, at any given time. A current driver indicated generally by numeral 23 is shown connected to the voltage driver output at terminal 15. The current driver, 23, according to the inventive principles, as shown in the preferred embodiment, contains a primary or master current driver shown as 23a and a slave or secondary current driver shown as 23b. In the preferred embodiment, the master/primary and slave/secondary sides of the current driver 23 are shown in a current mirror configuration. However, as would be understood by those skilled in the art, the inventive principles are not limited to a current mirror but may be applied to any current driver capable of operating according to the relationships as shown in the following.

In the preferred embodiment, the bus connected load RLoad is shown at the emitter follower output of the slave or secondary side 23b of the current driver 23. The master or primary side of the current driver 23 is shown as having an input impedance RI connected as an emitter follower. The input impedance RI is constant and as explained controls the maximum rate of change dI/dt of a current I into RLoad at the Bus Input terminal and the maximum current I into RLoad.

In the preferred embodiment, the current driver is a current mirror with transistors $Q_1, Q_2$ in the primary or master side 23a and transistors Q3 and Qout in the secondary or slave side 23b.

For the case where the geometries of $Q_2$ and $Q_3$ of the current driver 23, are the same, then I the current through RI is substantially equal to Iout the current through RLoad, where RLoad≦RI. Where RLoad>RI, then the current Iout will be dependent on the value of RLoad, as explained below.

The rate of change of current dI/dt is:

$$\frac{dI}{dt} = \frac{\frac{dv}{dt}}{RI} \quad \text{for } RLoad \leq RI \quad (4)$$

In the configuration shown for the preferred embodiment, the current in the slave or secondary side 23b of the current driver is controlled by the current through transistor Q2 in the primary or master side 23a. The current Iout through RLoad will increase and its rise time dI/dt will increase until RLoad is less than RI. Where RLoad is less than RI, then the current Iout into RLoad from the secondary or slave side 23b of the current driver 23 will be a maximum equal to:

$$\frac{V_{max} - V_{beQ1}}{RI} \quad (5)$$

Where Vmax, is the maximum voltage of Vout at terminal 15 and $V_{beQ1}$ represents the voltage drop in a current driver, shown as $V_{beQ1}$ for the preferred embodiment.

The maximum rise time of the current dI/dt to the load RLoad at the Bus Input terminal and connected to the secondary or slave side 23b of the current driver 23 will be $$\frac{dI}{dt} = \frac{\frac{dv}{dt}}{RI} \quad (6)$$

Where the magnitude of the output current, Iout, of the current driver, shown in the preferred embodiment as the output of the slave or secondary side 23b of the current driver 23 is a magnitude N times greater than the current I through the master or primary side 23a of the current driver 23, then the output current rise time dI/dt at RLoad will be controlled by the value of RLoad until RLoad shown as a varying load in the preferred embodiment decreases to a value related to RI by the factor N as shown by the following equations.

For $$RLoad < \frac{RI}{N}$$

then the maximum current Iout at RLoad at the output of the slave or secondary 23b of current driver 23 is:

$$Iout(max) = \frac{V_{max} - V_{beQ1}}{RI} \quad (7)$$

For $$RLoad > \frac{RI}{N},$$

then the maximum current Iout at RLoad of the output of the slave or secondary side 23b of current driver 23, $$I_{out(max)} = \frac{V_{max} - V_{beQout}}{RLoad} \quad (8)$$

Where the current driver output is a magnitude N times greater than the current through its input, the controlling relationship between the resistance of the load RLoad and the input resistance of the current driver RI is related by that same factor N.

In particular, the current through RLoad will increase as RLoad decreases, until $$RLoad = \frac{RI}{N} \text{ or } N = \frac{RI}{RLoad} \quad (9)$$

As RLoad decreases to a value equal to RI/N, the current through RLoad is as shown by equation (8) above. As additional devices are added to the bus input terminal decreasing the resistance of RLoad, to a value less than RI/N, the maximum current I out (max) as shown for equation (7) limited by the resistance of RI, at the input of the current driver is:

$$I\max = \frac{V\max - V_{beQ_1}}{RI} \quad (10)$$

Similarly, the maximum current rise time will be $$dI/dt = dv/dt/RI. \quad (11)$$

As explained above, the voltage dv/dt is the voltage V out at the output of voltage driver 11 reduced by the internal voltage drop within the current driver shown for the current mirror as $V_{be}$.

While the preferred embodiment uses a current mirror, as would be understood by those skilled in the art, any current driver capable of producing the above relationships would be suitable.

I claim:

1. An apparatus for maintaining a constant rise time for a voltage signal from a voltage driver, connected to a varying resistive load, comprising:
    a voltage driver;
    a varying load connected to said voltage driver;
    said voltage driver arranged to provide a voltage output signal from said voltage driver;
    means connected to said load and to said output signal, for supplying a current to said load responsive to said output signal; and wherein,
    said means connected to said load includes means applying an input impedance to said output signal; and
    said current to said load has a maximum rise time limited by said input impedance.

2. The apparatus of claim 1, wherein:
    said varying load includes a bus arranged for connection to a plurality of load combinations;
    said bus having an impedance,
    the impedance of said bus changing in response to the connection of said combinations; and
    said means connected to said load having means for isolating said bus from said voltage output signal.

3. The apparatus of claim 2, wherein:
    said impedance is a constant impedance.

4. The apparatus of claim 2, wherein:
    said means includes first means producing a first signal responsive to said voltage output signal; and
    said means includes a second means connected to receive said first signal and produce a load output signal.

5. The apparatus of claim 4, wherein:
    said second means is arranged to produce said load output signal responsive to first signal for said varying load.

6. The apparatus of claim 5, wherein:
    a rise time and a fall time of said load output signal are determined by said impedance.

7. The apparatus of claim 1, wherein:
    said means connected to said load and said output signal includes:
    an output bus,
    a first current means connected to said output signal and having a constant input impedance;
    a second current means connect to said first current means and to said output bus;
    said second current means arranged to provide a current to said bus for said varying of load, responsive to said voltage output signal.

8. The apparatus of claim 7, wherein:
    said second current means includes cascaded current means for increasing the current to said varying load by a factor N in relation to the current produced by said first current means.

9. The apparatus of claim 7, wherein:
    said first and second current means are arranged in a current mirror.

10. The apparatus of claim 7, wherein:
    said constant input impedance is an impedance RI;
    said varying load connected to said concurrent means is an impedance RLoad;
    said second current means produces a current to said varying load related to said current in said first current means by a factor N;
    said maximum current to said varying load is arranged to be limited by RI/N for RLoad less than RI/N;
    and the maximum rise time of the current into said varying load is arranged to controlled by RI where RLoad is less than RI/N.

* * * * *